(12) United States Patent
Lambkin et al.

(10) Patent No.: US 7,807,972 B2
(45) Date of Patent: Oct. 5, 2010

(54) RADIATION SENSOR WITH CAP AND OPTICAL ELEMENTS

(75) Inventors: Paul Lambkin, Carrigaline (IE); William A. Lane, Waterfall (IE); Andrew David Bain, Adare (IE)

(73) Assignee: Analog Devices, Inc., Norwood, MA (US)

( * ) Notice: Subject to any disclaimer, the term of this patent is extended or adjusted under 35 U.S.C. 154(b) by 137 days.

(21) Appl. No.: 12/069,484

(22) Filed: Feb. 11, 2008

(65) Prior Publication Data
US 2008/0202209 A1   Aug. 28, 2008

Related U.S. Application Data

(63) Continuation-in-part of application No. 11/584,725, filed on Oct. 20, 2006, which is a continuation-in-part of application No. 11/045,910, filed on Jan. 26, 2005, now Pat. No. 7,326,932.

(51) Int. Cl.
*H01L 27/146* (2006.01)
*H01L 27/14* (2006.01)

(52) U.S. Cl. ............ 250/353; 250/338.1; 250/338.4; 250/339.01; 250/339.02; 250/349; 257/431; 257/432; 257/433; 257/434; 257/435

(58) Field of Classification Search .......... 250/338.1, 250/338.4, 339.01, 339.02, 349, 353; 257/431–435
See application file for complete search history.

(56) References Cited

U.S. PATENT DOCUMENTS

| | | | |
|---|---|---|---|
| 4,286,225 A | 8/1981 | Morong, III | |
| 4,360,784 A | 11/1982 | Bartlett | |
| 4,682,030 A * | 7/1987 | Rose et al. ............... | 250/338.3 |
| 4,994,664 A | 2/1991 | Veldkamp | |
| 5,034,608 A | 7/1991 | Tavrow et al. | |
| 5,210,400 A | 5/1993 | Usami | |
| 5,528,038 A | 6/1996 | Yoshiike et al. | |

(Continued)

FOREIGN PATENT DOCUMENTS

EP   0646972 A2   4/1995

(Continued)

OTHER PUBLICATIONS

International Search Report and Written Opinion from corresponding International application No. PCT/EP2009/051506 mailed Jul. 6, 2009.

(Continued)

*Primary Examiner*—David P Porta
*Assistant Examiner*—Casey Bryant
(74) *Attorney, Agent, or Firm*—Knobbe, Martens, Olson & Bear LLP

(57) ABSTRACT

The invention provides a sensor including a first sensor element formed in a first substrate and at least one optical element formed in a second substrate, the first and second substrates being configured relative to one another such that the second substrate forms a cap over the first sensor element. The cap includes a diffractive optical element and an aperture stop which collectively determine the wavelength of incident radiation that is allowed through the cap and onto the at least one optical element.

48 Claims, 12 Drawing Sheets

U.S. PATENT DOCUMENTS

| | | | |
|---|---|---|---|
| 5,550,373 A * | 8/1996 | Cole et al. | 250/338.1 |
| 5,567,942 A | 10/1996 | Lee et al. | |
| 5,650,624 A | 7/1997 | Wong | |
| 5,668,033 A | 9/1997 | Ohara et al. | |
| 5,701,008 A | 12/1997 | Ray et al. | |
| 5,721,430 A | 2/1998 | Wong | |
| 5,754,088 A | 5/1998 | Fletcher et al. | |
| 5,914,488 A | 6/1999 | Sone | |
| 5,962,854 A * | 10/1999 | Endo | 250/349 |
| 6,038,065 A * | 3/2000 | Borden | 359/359 |
| 6,048,092 A | 4/2000 | Kimura et al. | |
| 6,215,816 B1 | 4/2001 | Gillespie et al. | |
| 6,222,454 B1 | 4/2001 | Harling et al. | |
| 6,252,229 B1 | 6/2001 | Hays et al. | |
| 8,249,171 | 6/2001 | Yaklin et al. | |
| 6,359,276 B1 | 3/2002 | Tu | |
| 6,392,232 B1 | 5/2002 | Gooch et al. | |
| 6,460,411 B1 | 10/2002 | Kersjes et al. | |
| 6,504,155 B1 | 1/2003 | Ookawa | |
| 6,965,107 B2 * | 11/2005 | Komobuchi et al. | 250/338.1 |
| 7,064,442 B1 | 6/2006 | Lane et al. | |
| 7,326,932 B2 | 2/2008 | Hynes et al. | |
| 7,435,964 B2 | 10/2008 | Lane et al. | |
| 2001/0035559 A1 | 11/2001 | Ando et al. | |
| 2002/0175284 A1 | 11/2002 | Vilain | |
| 2002/0191819 A1 | 12/2002 | Hashimoto et al. | |
| 2003/0075794 A1 | 4/2003 | Felton et al. | |
| 2003/0209893 A1 | 11/2003 | Breed et al. | |
| 2003/0213910 A1 | 11/2003 | Anderson et al. | |
| 2004/0173751 A1 | 9/2004 | Komobuchi et al. | |
| 2006/0091300 A1 | 5/2006 | Nishimura | |
| 2006/0163453 A1 | 7/2006 | Hynes et al. | |
| 2007/0108388 A1 * | 5/2007 | Lane et al. | 250/353 |
| 2007/0120060 A1 * | 5/2007 | Lane et al. | 250/353 |
| 2007/0138394 A1 * | 6/2007 | Lane et al. | 250/353 |
| 2007/0138395 A1 | 6/2007 | Lane et al. | |
| 2008/0061237 A1 | 3/2008 | Franz et al. | |
| 2008/0164415 A1 * | 7/2008 | Kierse et al. | 250/353 |

FOREIGN PATENT DOCUMENTS

| | | |
|---|---|---|
| JP | 07092026 | 4/1995 |
| JP | 08145787 | 6/1996 |
| JP | 08261835 | 10/1996 |
| JP | 2000338389 | 12/2000 |
| WO | WO 00/03215 | 1/2000 |
| WO | WO 01/09579 | 2/2001 |
| WO | WO 2006/079588 | 8/2006 |

OTHER PUBLICATIONS

International Search Report and Written Opinion from corresponding International Application No. PCT/EP2009/051506 mailed Jul. 6, 2009.

International Search Report and Written Opinion in International Application No. PCT/EP2007/061091 dated Jan. 4, 2008.

International Search Report and Written Opinion in International Application No. PCT/EP2007/061093 dated Jan. 29, 2008.

International Search Report and Written Opinion in International Application No. PCT/EP2007/061099 dated Feb. 12, 2008.

International Search Report in International Application No. PCT/EP2006/050174 dated Apr. 13, 2006.

Mori, T. et al., Vaccum-encapsulated thermistor bolometer type miniature infrared sensor, IEE, Jan. 1994, pp. 257-262.

* cited by examiner

RADIATION SENSOR WITH CAP AND OPTICAL ELEMENTS

RELATED APPLICATIONS

This application is a continuation-in-part of co-pending U.S. patent application Ser. No. 11/584,725 filed Oct. 20, 2006 and titled "Sensor" which is a continuation-in-part of U.S. patent application Ser. No. 11/045,910 filed Jan. 26, 2005 and titled "Sensor", now granted on Feb. 5, 2008 as U.S. Pat. No. 7,326,932, which applications are hereby incorporated by reference.

FIELD OF THE INVENTION

The present invention relates to sensors and in particular to a sensor formed from two substrates using semiconductor processing techniques. The invention more particularly relates to an arrangement incorporating narrowband response characteristics for use in applications such as gas sensors or the like.

BACKGROUND

Sensors are well known in the art. When formed in a semiconductor material such as silicon or germanium such sensors may be provided as mechanical structures, for example as a MEMS arrangement, or electro-magnetic (EM) radiation sensors such as infra-red (IR) sensors. By using materials such as silicon it is possible to form the sensor in one or more layers of the wafer from etching and other semiconductor processing techniques so as to result in a desired configuration. Due to the delicate nature of the sensors and their sensitivity to the surrounding environment it is known to provide a protective cap over the sensor, the cap serving to isolate the environment of the sensor from the ambient environment where the sensor is operable.

Current infrared absorption gas sensors frequently use a discrete thermal sensor, e.g. a thermopile, with an external thin film filter which provides a received energy wavelength response that is tuned to the gas absorption band of interest. While generally effective, this provides a solution which requires more assembly operations and therefore cost, resulting in a more expensive device. Creation of a low cost means of providing sensor and filtering function, possibly together with signal processing electronics all in one device has been difficult as the thin film filters are specialised and difficult to manufacture with the standard IC processing equipments and materials.

SUMMARY

These and other problems are addressed in accordance with the teaching of the present invention by a sensor formed from two substrates using semiconductor processing techniques. The two substrates are arranged relative to one another so as to provide a first sensing element in one substrate and a cap for that sensing element above that sensing element so as to form a sensor cell. The cap is configured to incorporate an optical element which selectively focuses incident radiation onto the sensing element. Desirably the optical element is a diffractive optical element which, will be appreciated, is a passive component that redirects chosen wavelengths of the incoming light to a predefined position on the sensing element. As the ultimate position is related to the wavelength of the incident radiation and the specifics of the diffractive optical element, the optical element may be used in conjunction with an aperture stop to modify the narrowband response characteristics of the sensor cell.

The sensor may include two or more cells, each having a sensing element formed in a first substrate and a cap for that sensing element formed in a second substrate. Where two or more cells are provided, it is desirable that at least a first and second cell differ from one another in their response characteristics and at least one of the cells is configured to provide for narrowband filtering.

By providing two co-located cells whose response characteristics differ, it is possible to reference the output of a first cell using that of a second cell. This may be useful in a plurality of applications including that of gas sensors.

Accordingly, a first embodiment of the invention provides an electromagnetic sensor according to claim 1.

These and other features of the invention will be understood with reference to the following drawings which are provided for an understanding of the teaching of the invention and are exemplary embodiments and are not intended to limit the invention in any way.

BRIEF DESCRIPTION OF THE DRAWINGS

The present invention will now be described with reference to the accompanying drawings in which.

DETAILED DESCRIPTION OF THE DRAWINGS

The invention will now be described with reference to exemplary embodiments of FIGS. 1 to 14. Although the invention has application in any electro-magnetic (EM) radiation sensing environment, for the ease of explanation it will now be described with reference to a preferred illustrative embodiment, that of a silicon wafer-based gas sensor. While it is possible for each of the embodiments illustrated hereinafter to be used in combination with one another it will be understood that the invention is not to be construed in this limiting fashion as features and components of one embodiment may or may not be used with those of another embodiment. In this way the invention is only to be limited insofar as deemed necessary in the light of the appended claims.

In our earlier co-assigned applications such as U.S. Ser. No. 11/584,725 we have described a number of structures that provide electromagnetic radiation sensors. Such structures were discussed with reference to fabrication in first and second substrate so as to enable provision of a cap element in a first substrate that is then locatable over sensing devices—such as bolometers or the like provided in a second substrate. By incorporation of optical elements, such as diffractive optical elements (DOEs) into the cap, it is possible to selectively focus light of a desired wavelength through the cap and onto the sensing devices on the second substrate. It will be understood that as incident radiation on a DOE is diffracted according to its specific wavelengths, that use of a suitably patterned DOE with a corresponding aperture stop may be used to selectively filter the incident radiation such that only that radiation meeting a predetermined wavelength criteria is transmitted through the cap and onto the sensing element provided below. Applications of such structures with reference to gas sensors is particularly advantageous in that selective wavelength filtering could be used to determine the presence or otherwise of specific gas constituents with the ambient environment.

To fabricate such devices, a sensor device (or array of repeating sensor devices) is manufactured on one wafer substrate and a capping wafer is manufactured on a separate substrate. The capping wafer is joined to the sensor wafer and bonded to it under controlled ambient conditions, the preferred embodiment being under vacuum conditions. This bonded wafer arrangement can be singulated or sawn into individual capped sensor chips or cells for final packaging and sale. Such capping methodologies are well described in US Application No. 20030075794 of Felton et al which is assigned to the Assignee of the present invention, and the contents of which are incorporated herein by reference.

Figure 1:
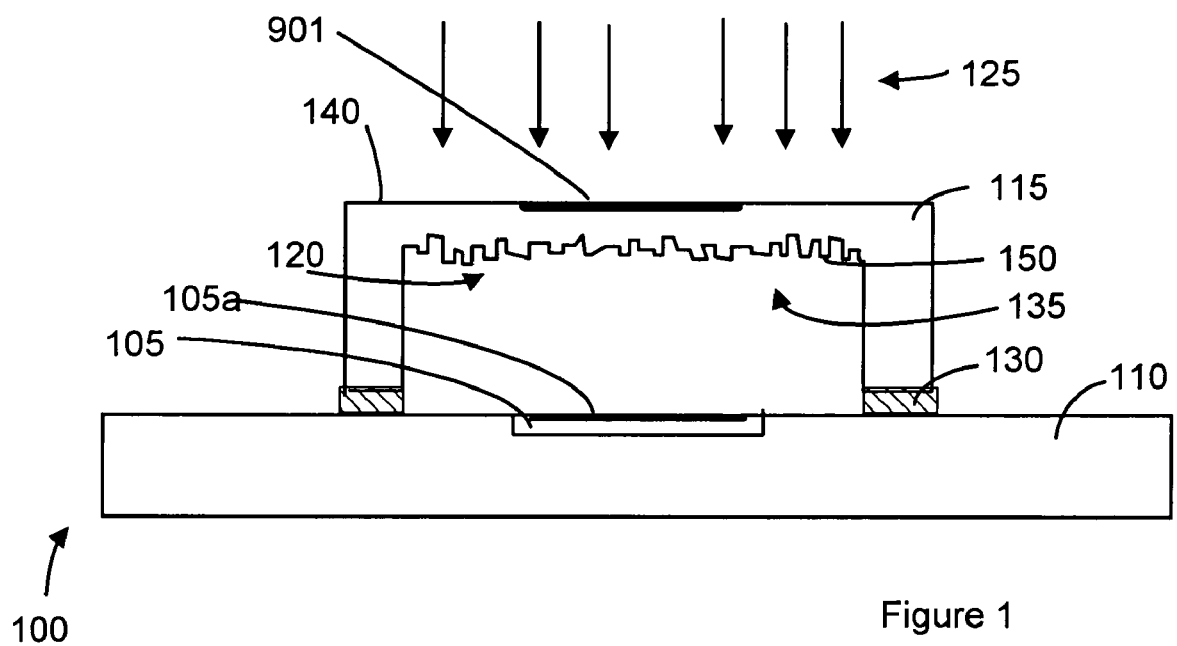
FIG. 1 is a cross section through an illustrative embodiment of a sensor for practicing the present invention.
Figure 1A:
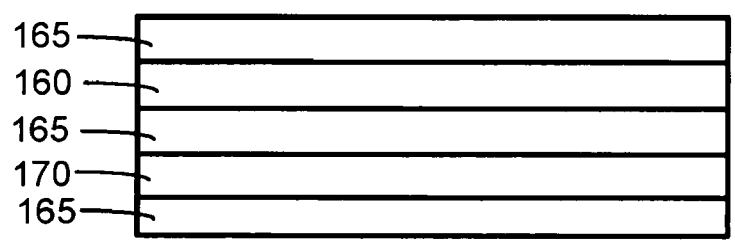
FIG. 1a is a section through portion of a multi-layer sensor element that may be usefully employed within a sensor of the present invention.
Figure 1A:
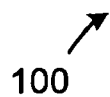

FIG. 1 shows a cross section through a sensor device 100. The device includes a sensor or sensing element 105 formed in a first silicon wafer 110 or what is sometimes called a sensor die. As shown in FIG. 1A which is as will be appreciated highly schematic, the sensing element is desirably formed from a multilayer structure or stack having at least one absorber layer 160 provided therein. Also provided within such a multilayer structure are typically a number of dielectric layers 165 and at least one resistor layer 170, the electrical properties of which can be monitored as an indicator of changes in incident radiation on the sensor element. It will be appreciated that such a structure has both a planar dimension and a depth dimension. Both these parts of the sensor element or optical pixel have an impact on the responsiveness of the sensor device. By suitably modifying the stack structure it is possible to broadly tune the responsiveness of the sensor element to a wavelength region It will be appreciated that an example of such a modification could be resultant from adjusting the relative thicknesses of the absorber layer(s) and the associated dielectric layers around it so as to shift the broad response of the overall stack into the desired wavelength region A second part of the sensing element which has an effect on the optical characteristics of the sensing element is its physical planar dimension. It will be appreciated from an examination of FIG. 1 that while the sensing element 105 may occupy a specific region within the first silicon wafer or substrate that its optical response area 105a may be smaller than that region. The sensing element 105 may not be optically sensitive across its planar area in that only a sub-region 105a of the sensing element may be active. It is the planar sensitive or active region 105a and its X-Y dimension that can be usefully employed in determining the fine tuning aspects of the responsiveness of the sensor device 100.

As part of the sensor device 100, a cap 115 consisting of a silicon lid, into which patterns 120 are etched, to form an individual diffracting optical element, is also provided. An aperture stop 901 is also included as part of the cap. The combination of the diffractive optical element and the aperture stop provide elements of a narrowband filter for the sensor. These elements in combination with the planar physical dimensions of the active region 105a of the sensing element are usefully employed in determination of the narrow band response characteristics of the sensor. This will be described in more detail below.

Two possible approaches to implementing such diffractive optical element (DOE) are known as amplitude modulation and phase modulation respectively. In the case of amplitude modulation, the surface pattern consists of areas that allow transmission of the radiation and areas that block the radiation. In the case of phase modulation the pattern consists of height variations on the surface that effectively modify the relative phase of the radiation as a function of the relative height differences of the pattern. In this illustrated embodiment the pattern is provided on an interior surface 135 of the cap, but it will be appreciated that it could also be provided on an exterior surface 140. It will also be appreciated that the pattern, whose geometry is exaggerated for ease of viewing, includes a plurality of ridges 150 whose distance apart and depth is related to the wavelength of light with which the optical element is being used.

The cap is typically formed in a second silicon wafer or capping die. This pattern 120 defined in the diffracting optical element cap 115 is capable of focusing incident radiation 125 of a given frequency onto the sensing element 115. This can be a focusing onto a specific plane of the sensor or onto a specific point on the sensor or indeed of focusing different frequencies onto different points. The cap 115 is bonded to the first wafer using a bond or seal material 130 and the bonding defines a sealed cavity 145, which can be at a different pressure than ambient pressure, typically a lower pressure. Alternatively, the sealed nature of this cavity and the manufacturing process allows the ambient gas within the cavity to be different to air, for example one could use Xenon which has a lower thermal conductivity than air. It will be understood that xenon is provided only as an example of the type of other gas that may be usefully employed within the teaching of the present invention. Although a silicon cap is substantially opaque to incident light in the visible spectrum and therefore it may be considered that it occludes the light from impinging on the sensing element within, it will be appreciated that silicon allows a transmission of light in the infra-red frequencies of the EM spectrum and therefore for this exemplary application, the provision of an IR gas sensor, it is a suitable material.

Figure 2:
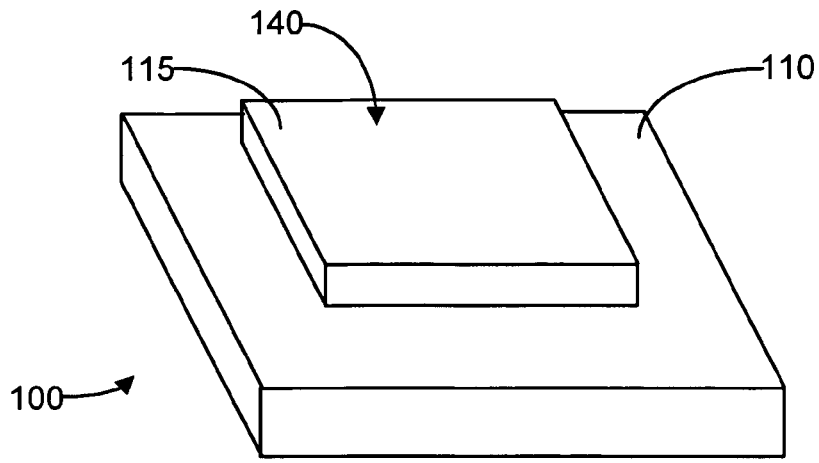
FIG. 2 is a perspective view from above of the sensor of FIG. 1.

FIG. 2 shows an example of an assembled sensor device from which it will be seen that the sensing element is covered by the cap provided above it.

Figure 3:
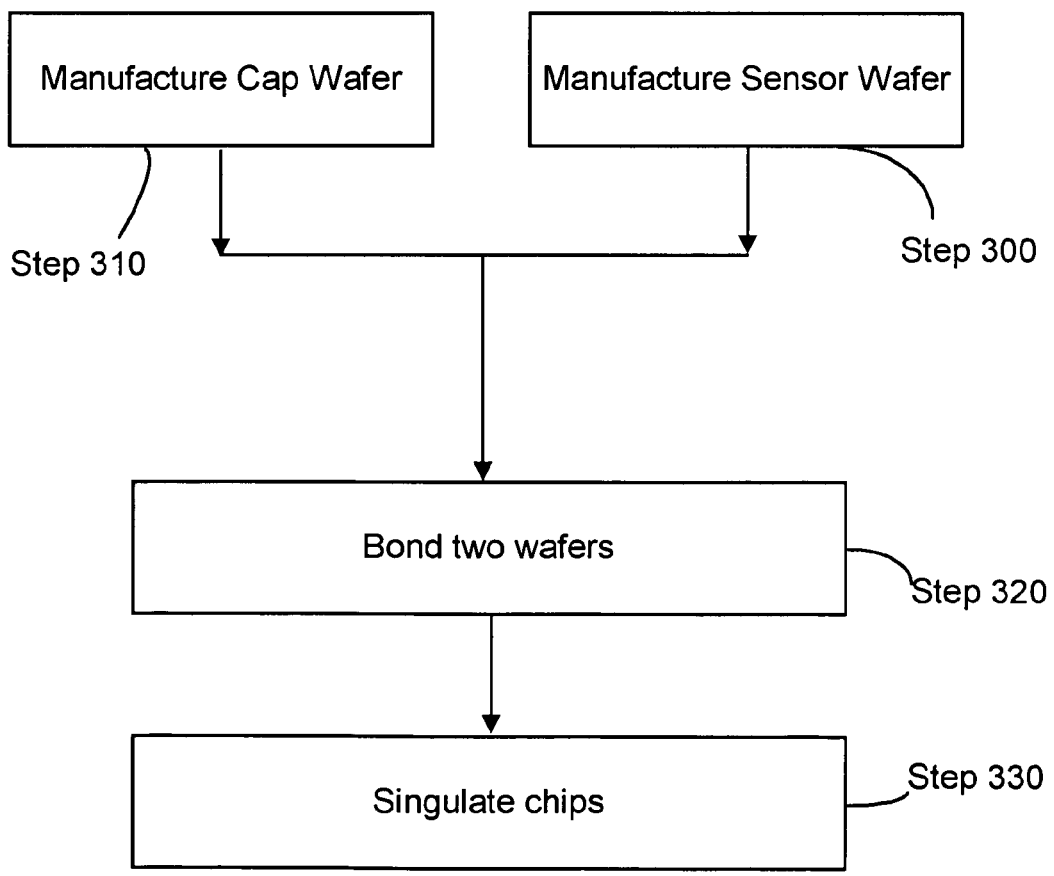
FIG. 3 is an example of a methodology that may be employed for forming the sensor of FIG. 1.

A typical process flow for manufacture of the sensor is shown in FIG. 3. Firstly, the sensor wafer 110 is manufactured using techniques that will be well known to those in the art (Step 300). The capping wafer is also manufactured (Step 310) separately. The manufacture of this capping wafer includes the etching of a desired pattern on either or both of the outer 140 or inner surface 135 of the cap. A structure for forming a narrowband filter in the form, for example of an aperture stop, may also be included at this stage. The aperture stop could be provided on either the outer 140 or inner 135 surfaces of the cap separate to the desired pattern, or could be integrally formed as part of the optical element. It will be understood that the aperture stop determines the amount of incident radiation that may be passed through the cap. The dimension and orientation of the aperture stop will determine which wavelengths of the incident radiation are subsequently incident onto the radiation sensing element in the substrate below. An anti-reflective coating may additionally be added to the cap surface, either inner or outer. Once the desired components on each of the two wafer substrates are provided, the wafers may be brought together so as to be bonded (Step 320). Ideally, this bonding is achieved under vacuum conditions. Once the two wafers have been brought together individual chips may be singulated or defined within the total area of the wafers by removing the areas of the second wafer that do not define the cap (Step 330). In this manner a plurality of individual chips or sensors may be provided in one process flow.

Figure 4A:
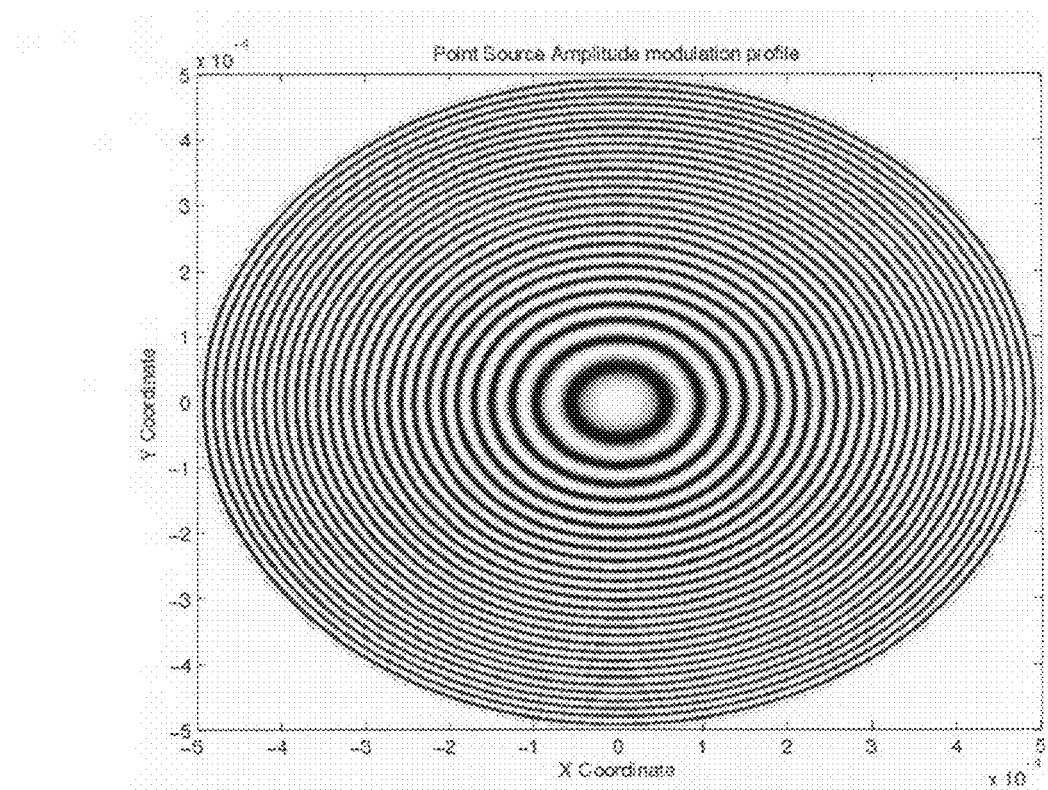
FIG. 4A is an example of a first pattern that may be used to define an optical element in accordance with the teachings of the present invention.
Figure 4B:
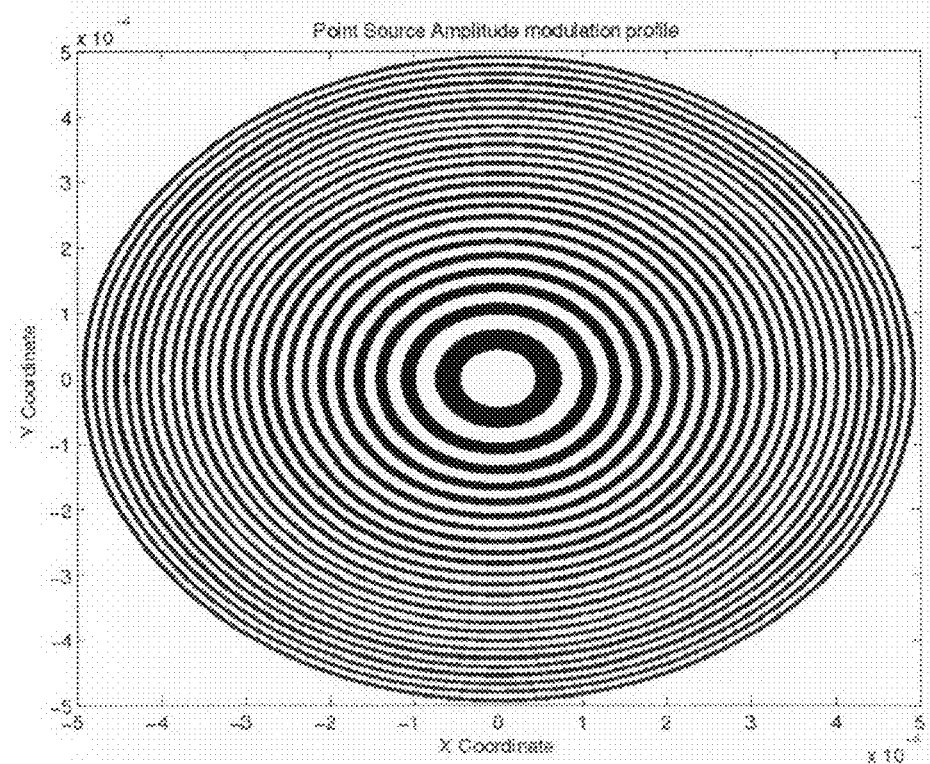
FIG. 4B is an example of a second pattern that may be used to define an optical element in accordance with the teachings of the present invention.
Figure 4C:
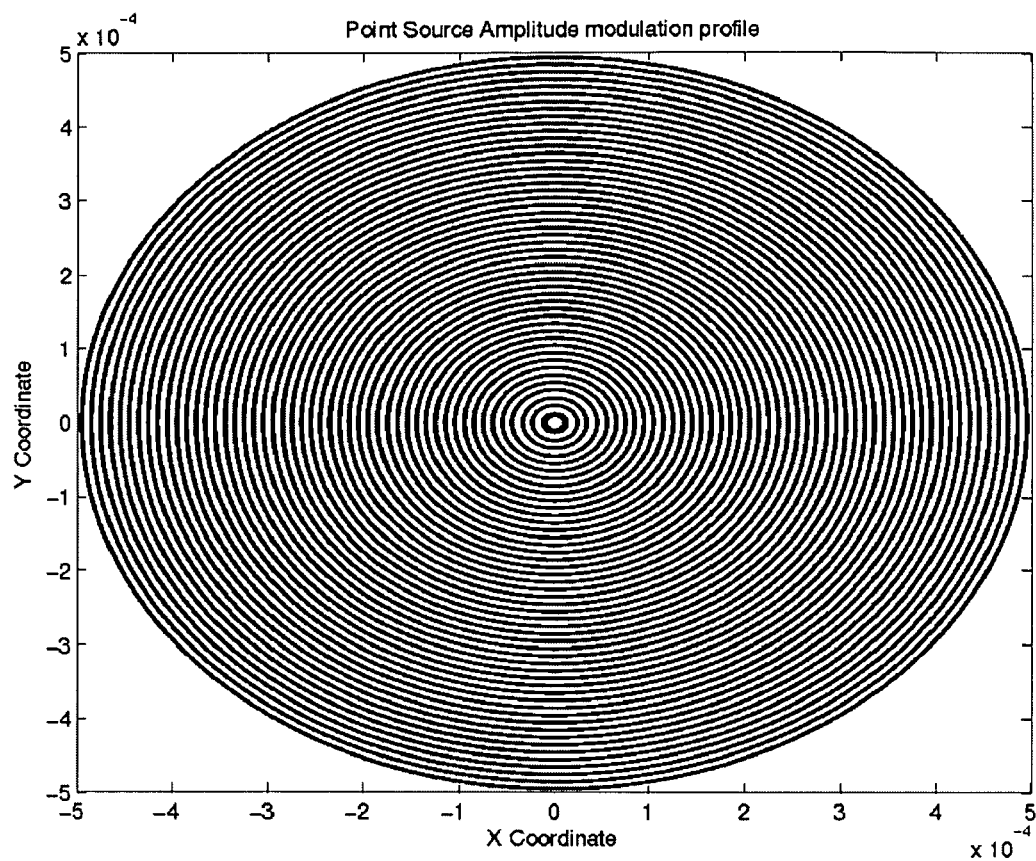
FIG. 4C is an example of a third pattern that may be used to define an optical element in accordance with the teachings of the present invention.

It will be understood that the nature of the pattern defining the optical element and the geometry of the aperture stop will affect how the sensor performs. FIG. 4 shows examples of pattern types, which can be implemented using either an amplitude modulation or a phase modulation approach, which may be used to define diffractive optics in the sensor cap. It will be understood that the teaching of the invention insofar as it relates to diffractive optical elements is not to be construed as being limited in any fashion to the following exemplary arrangements. The example of FIG. 4A is optimised for a focusing of parallel input light of wavelength 10 micrometer down to a focal plane 300 micrometer away using a sinusoidal variation in the height of the diffractive optical element for a phase modulation approach. The relative heights of the sinusoid are represented by the gray scale variation in the pattern, for an amplitude modulation approach the gray scale would represent the transmission efficiency of the pattern. The example of FIG. 4B is designed for a focusing of parallel input light of wavelength 10 micrometer down to a focal plane 370 micrometer away but in this case the black and white pattern represents a single step height variation to implement the grating of the phase modulated diffractive optical element rather than a sinusoidal variation. The example in FIG. 4C also uses a single step height variation to implement the diffractive optical element but in this case it is designed to focus parallel input light of wavelength 10 μm down to a focal plane 10 micrometer away. It will be understood that these three examples are illustrative of the type of pattern that may be used and that different design requirements regarding the control of the focus plane or independent control over different wavelength components within the incident radiation are also possible with this approach and are covered by this invention. These examples, consisting of black and white circles in FIGS. 4B and 4C can represent either a transmission pattern or a phase modulation pattern that focuses the light, but suffer in that losses in transmission are also achieved. It will be appreciated however that the design of the pattern may be optimised to achieve lower loss criteria such as for example introducing curved side walls in the ridge features defining the grating, as represented by the grayscale diagram of FIG. 4A.

The cap provided by the present invention is advantageous in a number of aspects. It serves to: 1) protect the membrane during subsequent handling, 2) it also provides a housing for the sensing membrane that can be evacuated during manufacture, and 3) it can be patterned and etched in such a way as to focus the incident infra red radiation onto a single point to amplify the signal or onto an array to create an image of a scene. In particular, the pattern can be such as to implement an optical element having a diffractive optical element. The creation of an optical element for this application is advantageous in that the lens can be implemented in silicon rather than the more exotic (and expensive) materials required heretofore for an infrared refractive lens. The advantage resulting from the use of diffractive optics in the silicon cap is that the lenses can be patterned and etched at the wafer batch level using well established processes and bonded to the sensor wafers, resulting in a cost effective lens compared to the refractive lens technologies heretofore employed. This approach may be applicable to other electromagnetic radiation sensors in addition to the infrared application described here. For example the cap could be made of quartz or in some cases standard glasses such as pyrex or possibly sapphire if the sensor is to be used for applications other than IR sensors.

Figure 5:
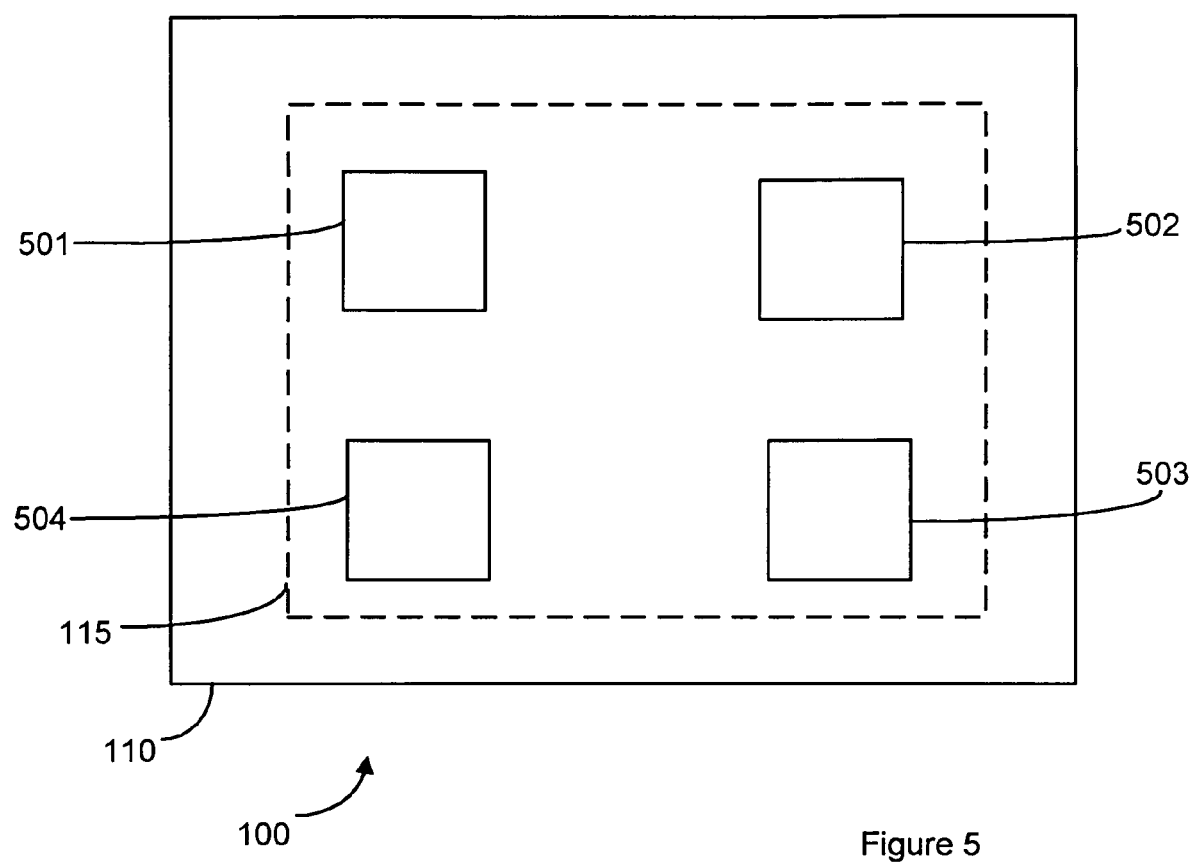
FIG. 5 is a plan schematic showing an example of a sensor including multiple sensor elements in accordance with an illustrative embodiment of the invention.

In some applications it may also be useful to be able to use the lens/cap configuration to focus different wavelengths within the incoming radiation onto different sensors enclosed by the cap. FIG. 5 is a schematic illustration of one such example where four sensing elements 501, 502, 503, 504 are provided within the same cap arrangement. It will be appreciated that suitable designing of the lens arrangement may allow for an optimisation of the sensor to focus one particular wavelength while defocusing (rejecting) others. This would allow individual intensity measurement of different wavelength components within the infrared radiation, a capability that could be very useful in for example gas analysis such as alcohol breath samplers where there is a desire to monitor the level of ethyl alcohol in the breath of a person. As alcohol has specific absorbance peaks in the IR spectrum, the focusing of radiation coincident with these peaks onto specific ones of the sensors elements 501, 502, 503, 504 provided in an array below the cap will enable the discrimination of any change in the intensity of the radiation at those specific frequencies therefore serve as an indicator of alcohol present in a sample. As each of the sensor elements are configured to react to incident radiation of a suitable frequency, when that radiation is incident on the individual sensors, an analysis of the performance of each of the sensor elements indicates the presence or absence of the material for which it is designed to react to providing a gas wavelength signature of the gas being analysed.

Figure 6:
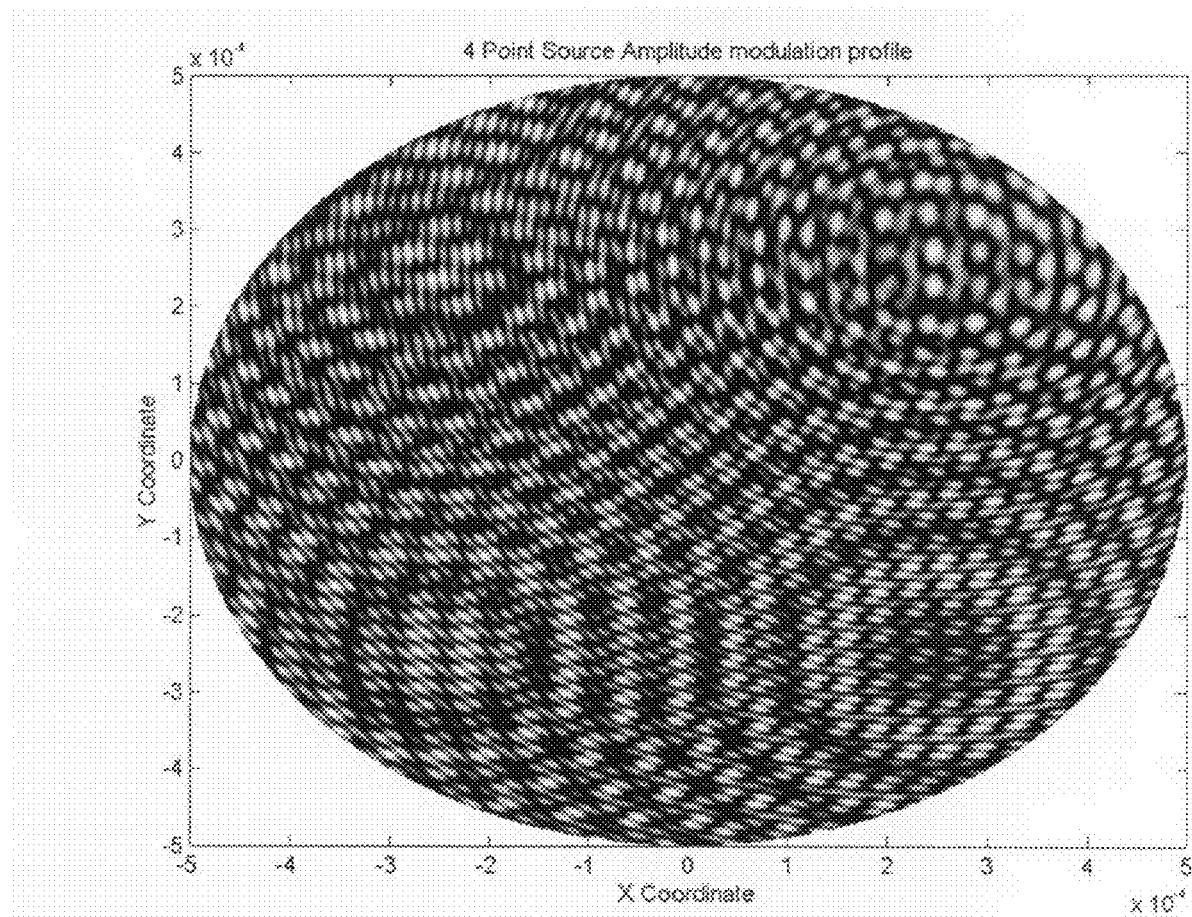
FIG. 6 is an example of a pattern that may be used to define an optical element suitable for use with multiple sensor elements in FIG. 5 in accordance with the teachings of the present invention.

FIG. 6 is an example of a diffractive optical element (DOE) design using an amplitude modulation approach that could be used in combination with the sensor arrangement in FIG. 5 to focus each one of four distinct wavelengths within the incident radiation onto one of the four sensing elements 501, 502, 503, 504 that are shown in FIG. 5. Such a design or pattern could be fabricated by creating a single step in the lens or providing multiple steps of different heights. It will be appreciated that the invention is not intended to be limited in any way as to the fabrication of a DOE in that it is intended to encompass all methods of manufacture be they single step, multiple step or other variants.

It will be understood that the techniques of the present invention provide an efficient way to provide an IR sensor array such as for example a 60×60 array. Such configurations are desirable for applications such as IR imaging where a sensor array of the present invention may be used to replace conventional IR arrays. Current IR arrays do not have the lens and sensor array integrated in a low cost unit as provided for by this invention. Current conventional IR arrays provide a vacuum package with an IR transparent window or lens in the package rather than the wafer level solution described by this invention.

The dimensions of a sensor in accordance with the present invention are typically of the order of micro to millimetres. For example when targeting radiation of a wavelength of 10 micrometers, a cap may be dimensioned to have a collection area of about 1 $mm^2$ and be of a height of about 160 micrometers above the sensor element. These dimensions are however purely for illustrative purposes only and it is not intended to limit the present invention to any one set of dimension criteria.

The fabrication of the sensor of the present invention has been described with reference to an etch process. Typically this etch will be of the type of process known as deep reactive ion etching (RIE) which inherently produces substantially vertical sidewalls (approximately 90 degrees). One of the advantages of such a process is that with such verticality less space is required for the cavity sidewalls. This directly affects the size of the "window" and thus the overall size of the cap which can be made. By reducing the cap size there is a reduction in the area required on the chip—with a corresponding reduction in the "wasted" space under and around the cap edges.

Heretofore, a sensor in accordance with the teaching of the invention has been described with reference to a sensing device with a transparent window. The invention also provides in certain embodiments for the fabrication of a second cell also incorporating a sensing device, which provides a different response to that of the first cell. This second cell then may be considered a reference cell, which differs from the first sensing cell in that its response may be used in combination with the sensing cell to allow for a discrimination in the response of the sensing cell. One example of this is to make the reference cell totally opaque so its sensor sees only the cap (i.e. 300K) in the case of IR sensors, but one could make the reference partially opaque so there was always a known fraction of the ambient radiation getting through. There would be advantages to this in applications for gas sensors where the reference cell could be illuminated with radiation coming through the same optical path as the sensing side except for the gas to be sensed. This would remove spurious dependencies of the signal on e.g. water vapour. A further example would be where the optical characteristics of the second cell are the same as that of the first cell but it is selectively illuminated with radiation of a different frequency, i.e. a different source of radiation, so as to provide an output which is different to but which can be compared with that of the first cell. In all cases however it will be understood that the second cell is configured to provide a different response output to that of the first cell with the variance in response of this second reference cell may be provided by altering the characteristics of the cap used for the second cell being used to reference or calibrate the output of the first cell.

Figure 7:
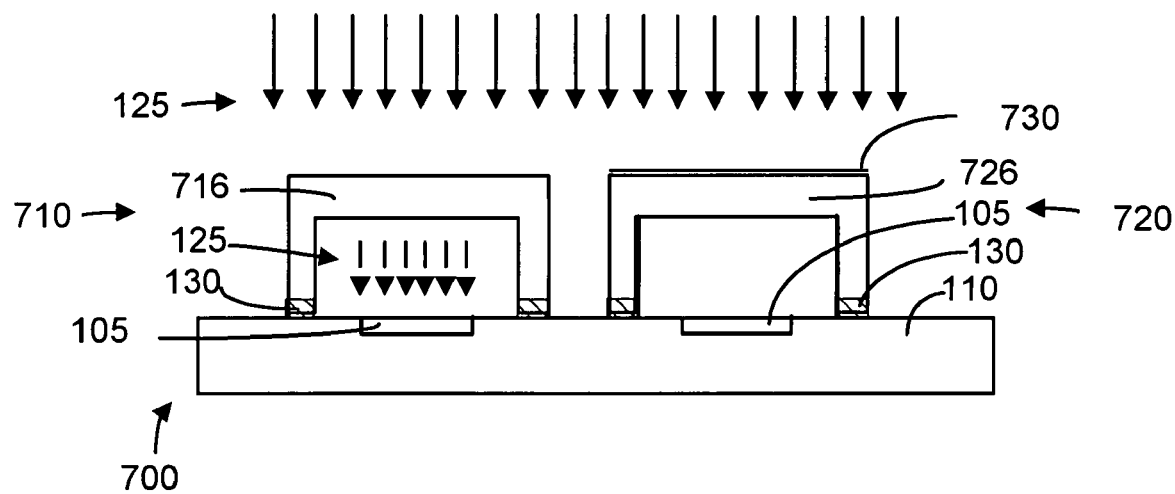
FIG. 7 shows a further embodiment where the sensor includes a reference element.

Typical embodiments will employ a reference cell with an optically opaque window. Such opacity may be used to provide a "dark" cell, one which will provide a signal output that is independent of the level of radiation being sensed by the first cell. FIG. 7 shows an example of such an arrangement. The same reference numerals will be used for components already described with reference to prior Figures.

In this arrangement a sensor device 700 includes a first cell 710 which provides an output indicative of the level of radiation incident on the sensor device and a second cell 720 which provides an output which is independent of the level of radiation incident on the sensor device. The first and second cells each include an IR sensor 105 formed on a first substrate 110 and each have a cap 716, 726 provided thereabove. The capping of each cell serves to define a controlled volume above each sensor, which as described above can be suitably evacuated or filled with a specific gas depending on the application. The second cell 720 differs from the first in that it is configured so as to prevent the transmission of radiation through the cap and onto the sensor 105. This may be achieved by providing an optically opaque layer 730 on the cell. The second cell can therefore be considered a reference cell, whose output is independent of the incident radiation. The output of this second cell can then be used to calibrate the output of the first cell, whose signal output will be determined by the intensity of the incident radiation thereon. Alternatively the DOE pattern chosen for the second cell could be used to selectively filter radiation of a second wavelength to that of the first sell, such that each cell provides an output in response to radiation of different wavelengths. This is particularly useful in the context of gas sensors, where one cell can be tuned to a first desired wavelength peak and the second to a second different peak. Relative scaling between the two peaks can be used to give an indicator of presence or otherwise of a specific gaseous compound.

It will be understood that by providing such a reference cell, that a sensor device in accordance with the teaching of the invention enables a detection of radiation by providing for a comparison between outputs of an exposed sensor and those of a reference darkened or otherwise differentiated response sensor. In this device only the optical properties of the reference sensor are changed, the thermal and electrical properties are the same as those of the illuminated sensor. In this way an accurate and precision sensing of incoming radiation is possible—be that IR radiation or any other type of electromagnetic radiation such as that in the visible spectrum.

Figure 8:
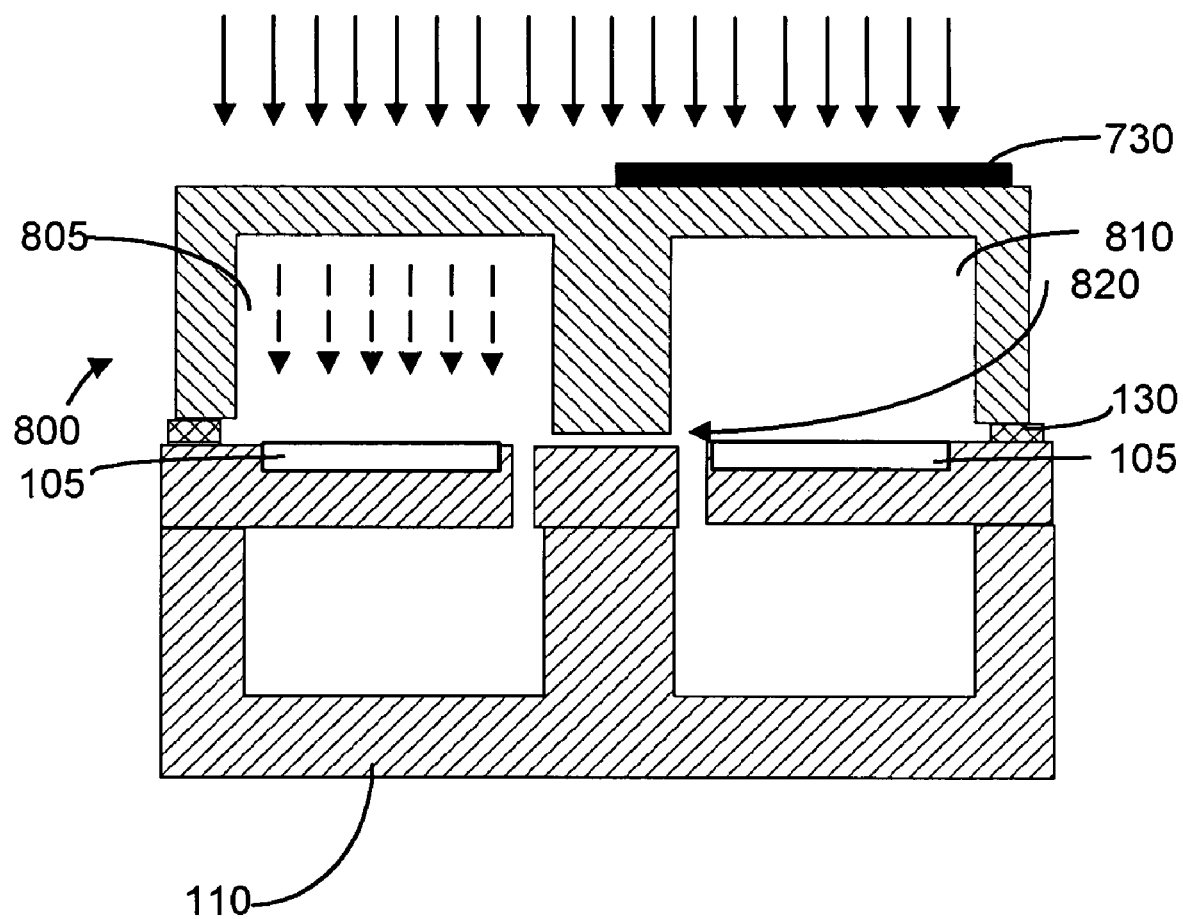
FIG. 8 shows a modification to the arrangement of FIG. 7.

The arrangement of the two cells shown in FIG. 7 is of two distinct cells, each being formed separately. Alternative arrangements such as that shown in FIG. 8, may provide a single cap 800 which is micro-machined to define two cavities or chambers 805, 810, one of which 805 is locatable over the illuminated element and the second 910 over the non-illuminated element. Each of the two defined areas has an IR sensitive element 105 and may be formed using any convenient process. The interior of the cap cavities may be filled with any desirable gas ambient (e.g. Air, Nitrogen, Argon, Xenon) or indeed simply provided as a vacuum. The cap is sealed to the substrate using a sealing process which can provide the necessary level of hermetic seal. Such techniques will be apparent to the person skilled in the art. The shield 730 which blocks the IR radiation is fabricated using (conveniently) a thin metal layer which will reflect incoming radiation. In order to avoid heating the cap non-uniformly, desirably the IR blocking layer should be a reflector, not an absorber. As shown in FIG. 8, a gap 820 in the sealing may be left between the individual lid chambers to allow the pressure in each chamber to equalise, independent of leak rate of the overall cap. Such an arrangement addresses the issue with many MEMS based IR sensor devices which are very sensitive to the ambient pressure.

In order to define the two chambers, a column 825 is provided. The column extends downwardly from the top 830 of the cap 800, and terminates at the gap 920 between the two chambers. The column may be coated with or doped to minimize the leakage of radiation between the two columns. Typical dimensions for the column are 50-100 microns wide and 170 microns high. The gap is typically of the order of 6 microns high which is of the order of the wavelength of the IR radiation being monitored so it is unlikely that any radiation could transfer through the gap from the illuminated cavity to the non-illuminated. However, if required further guarantees of the integrity of the dark cavity could be achieved by providing a step pattern—similar to a saw tooth arrangement—so as to allow the equalisation of pressure but occlude the transfer of radiation.

To further reduce the level of IR contamination within the un-illuminated cavity side, the walls of the separation region may also be coated with a reflecting metal (or other IR type barrier) to block IR which has been reflected from the illuminated surface. Alternatively this region may be treated (e.g. heavily doped to sufficient density using for example a polysilicon material or oxidized to sufficient thickness) in such a way as to absorb any reflected IR. The absorbing of the radiation is a preferred way to achieve the blocking of IR through the internal portions of the cavity as it ensures that it is taken out of the cavity as opposed to just bounced to another region—which would be the case in a reflective solution. The absorption provided by the side walls serves to damp down reflections to prevent the creation of spurious signals within each cell A further suitable technique could be to simply space the non-illumination sensor sufficiently from the illumination sensor so that the radiation will be absorbed naturally in the silicon.

It will be understood that a sensor arrangement in accordance with the teaching of the invention provides for the use of high thermal conductivity materials for the cap so as to ensure that the two sensing devices are exposed to the same temperature surface, thus again minimizing thermal contamination problems. While described with reference to silicon it will be understood that other materials such as germanium could also be used.

By using a capping arrangement such as that described herein it is possible to locate the illuminated and non-illuminated sensors adjacent to one another. As a result they can be fabricated at the same fabrication efficiency and the only difference between the two is the optical environment in which they operate. This is particularly useful for sensors that are used in high sensitivity applications where low differences in output between the two sensors (the reference and the active) are indicative of an actual measurement.

By providing at least two cells which differ in their response characteristics it is possible to define such active and reference cells as has been just described. The provision of the differing response characteristics can be implemented in any one of a number of different manners, for example by modifying the optical response characteristics, the electrical characteristics, the thermal response characteristics or even by keeping all these three characteristics the same and just illuminating each cell with a different source of irradiation.

The arrangements described heretofore are advantageous in that they enable the selective wavelength filtering of incident radiation onto sensing devices provided in the substrate below the cap. By providing one or more diffractive optical elements (DOEs) within the capping arrangement it is possible to tune the sensing devices for particular wavelengths. In this regard it will be appreciated that DOE lenses are highly wavelength sensitive (i.e. suffer from chromatic aberration). This property can be exploited for spectroscopic applications, one specific example being in gas sensors. As an example of an application in the gas sensing environment, we will now consider the example of detection of carbon dioxide $CO_2$ concentrations by measuring the relative absorption at two discrete wavelengths in the infrared corresponding to a strong and weak absorption lines.

By using a first and second sensing chambers, each of the chambers can be tuned to an appropriate wavelength by provision of a suitable lens in the cap defining each of the two chambers. The gas sensing DOE lenses described herein are based on the principal of dividing the available collection aperture between two lenses, so one lens is designed for example to collect radiation having a wavelength of 4.26 µm (the $CO_2$ absorption line) and the other for 3.6 µm (a reference line). This is at least 50% inefficient, since the useful $CO_2$ radiation falling on the reference lens is rejected and likewise for the reference wavelength falling on the $CO_2$ lens. Ideally, use of a single lens that efficiently spatially separates the two wavelengths would be preferable. This is possible in principal, but requires the ability to generate thick volume gratings which is not compatible using single etch step gratings. To write a thick volume grating would require the ability to controllably vary the refractive index in a 3D volume, a process achieved today using photorefractive holographic materials.

As will be appreciated from the discussion above, DOE lens design is a well established practice in the general case. The details of the quantisation used in defining the DOE surface have an influence on both the diffraction efficiency and bandwidth of the response. For a given design wavelength and focal length, the grating radii are fixed. However, there is freedom in the choice of maximum etch depth and number of quantisation steps.

Figure 9:
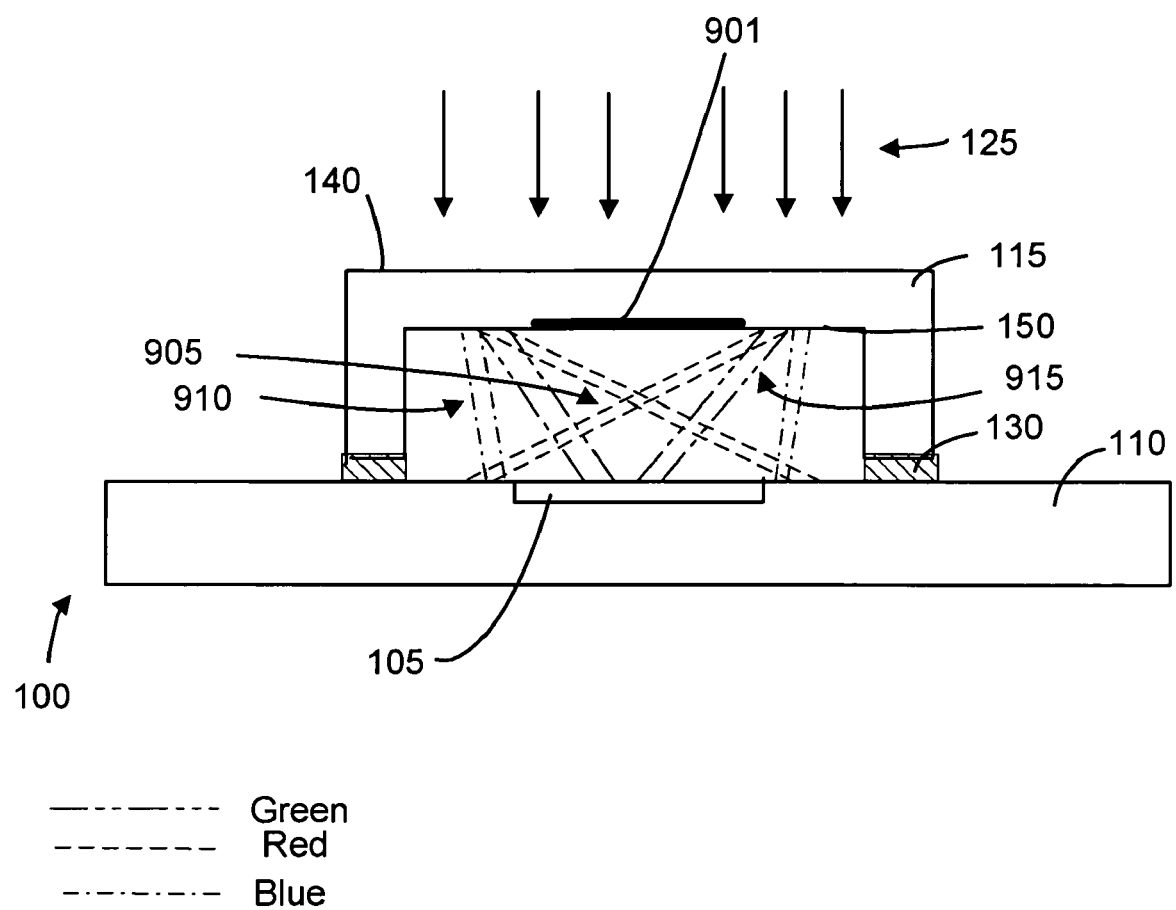
FIG. 9 shows an exemplary embodiment of a sensor configuration that may be used within the context of the present invention.

Generally, the greater the etch depth, the narrower the bandwidth and, more quantisation steps gives better diffraction efficiency. Unfortunately, using more than one mask to define the grating increases the efficiencies of the harmonics which would then require separate filtering. In addition, deep etches are technologically a bit more difficult and do not provide sufficiently narrow filter responses. As a result, it will be understood that one can limit the process to single step etches of minimum depth and obtain additional filtering function by employing an on axis stop and limiting the effective receiving area of the target pixel. Such an on-axis stop or aperture stop was mentioned above with reference to FIG. 1 but the ray diagram of FIG. 9 shows how such a stop may be employed. In this exemplary arrangement, the stop 901 is located on the bottom surface of the silicon and rejects both the red light 905 which has a longer wavelength (the rays shown as ----- rays) and blue light 1010 (-.-.-.-.-.-.-. rays) having a shorter wavelength than the desired predetermined design wavelength 915 (...---...---) referred to in the key to the drawing as Green. The 'green' light is unaffected by the stop 901 and therefore is incident on the sensing element 105. The 'blue' light would come to a focus behind the array and the 'red' focuses in front of it. If the receiving pixel (or an aperture defined on the pixel) has dimensions less than that indicated on FIG. 9, it can only detect within the band defined by the blue and red wavelengths. The spot diagram for three wavelengths (4.16, 4.26 and 4.36 µm) is given in FIG. 10 for a 250 µm radius stop. The stop generates a clearly defined shadow on the focal plane in the blue and red wavelengths. It will be understood that a pixel smaller than this shadow can only detect wavelengths within the band defined by the red and blue wavelengths. If the pixel size is physically bigger than the shadow, its effective size can be reduced by delineating, using standard lithographic techniques, an aperture on the pixel which is commensurate or smaller than the shadow.

Figure 10:
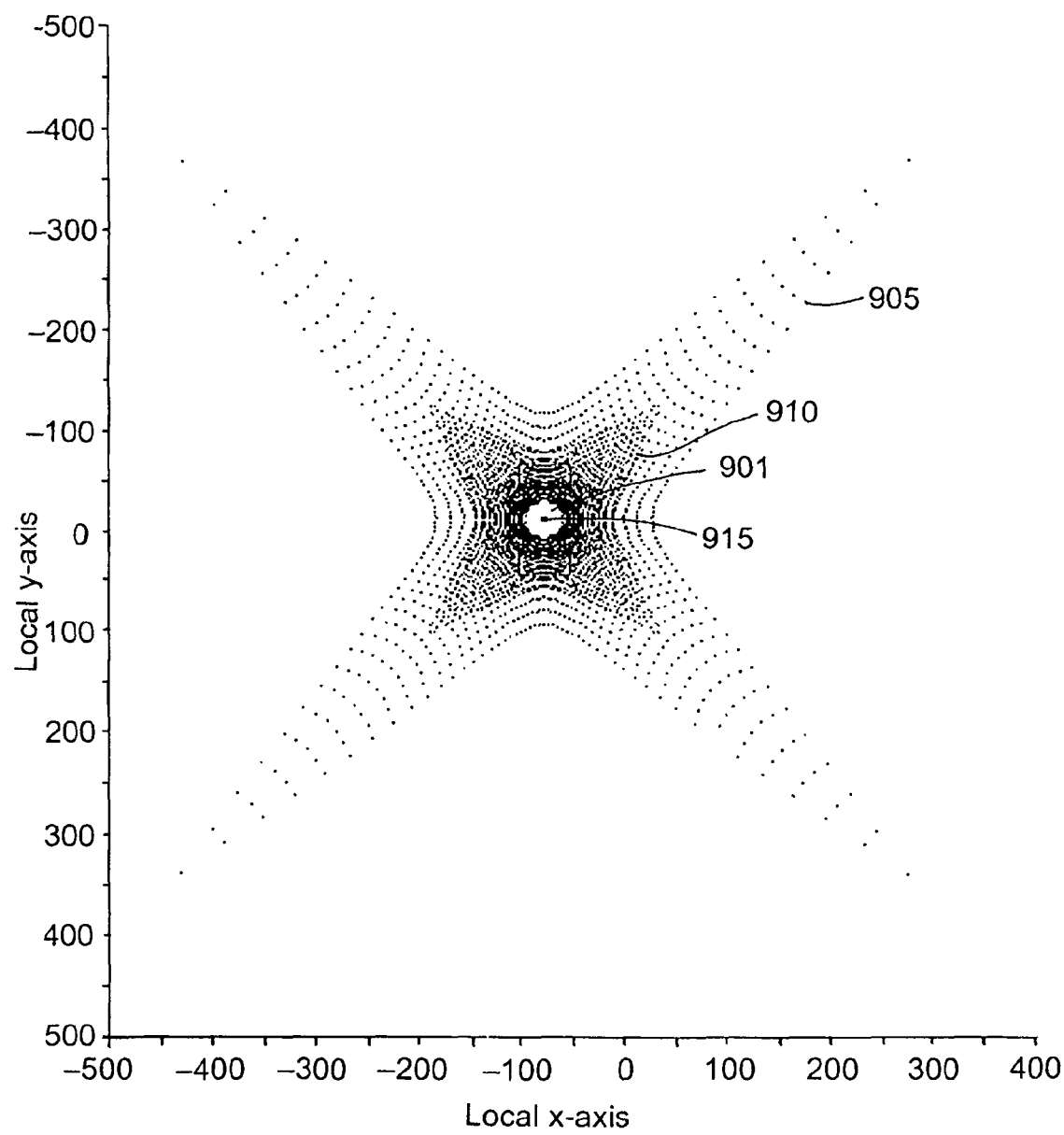
FIG. 10 shows a ray diagram for a capping arrangement incorporating an aperture stop in accordance with the teaching of the present invention.

It will be understood that for a given filter bandwidth the aperture stop must be larger if placed on the top surface of the cap as opposed to the bottom surface illustrated with reference to FIG. 10.

Figure 11:
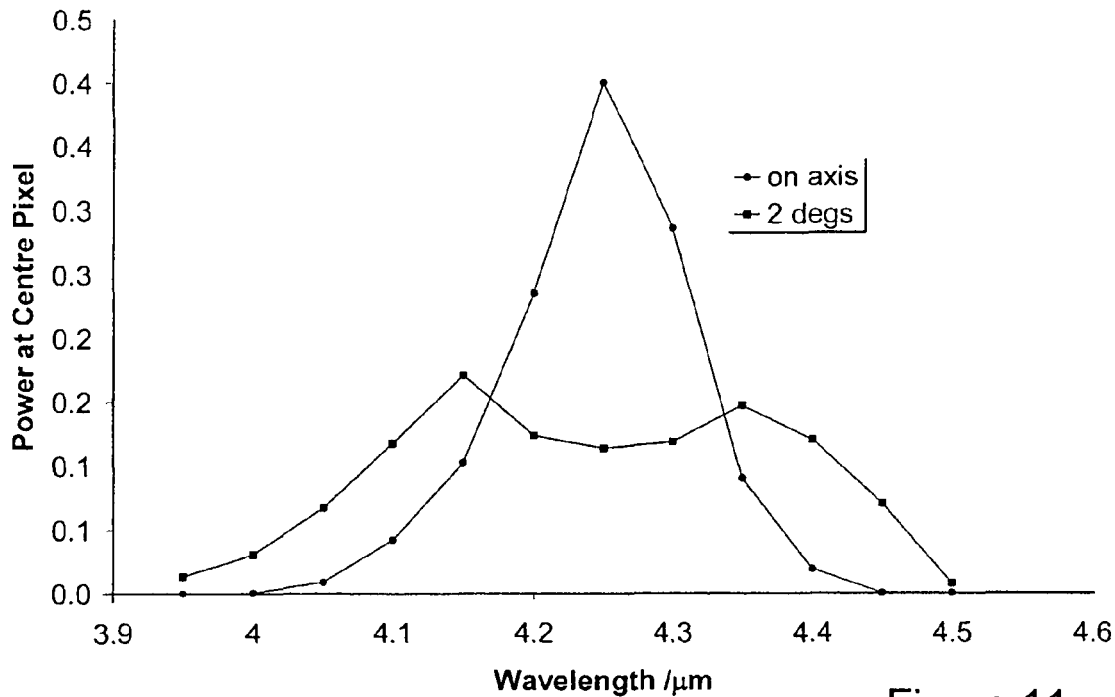
FIG. 11 shows a filter response of a $CO_2$ lens (ray tracing) using a 66.6 $\mu m^2$ centre pixel area, the response having been considered at 0° and 2° angle of incidence.

Using ray tracing techniques, given distribution of incident rays on the DOE lens, the subsequent distribution of rays on the detector pixel can be calculated as a function of wavelength and angle of incidence. Typical results are shown in FIG. 11 for a collimated beam incident on the lens both at normal incidence 0° and with a 2° offset. For on axis radiation, the full width half maximum (FWHM) bandwidth is better than 200 nm but is clearly very sensitive to incidence angle. For this example the DOE, focal length 370 µm, had a width of 1 mm and the pixel receiver width was 66.6 µm.

Figure 12:
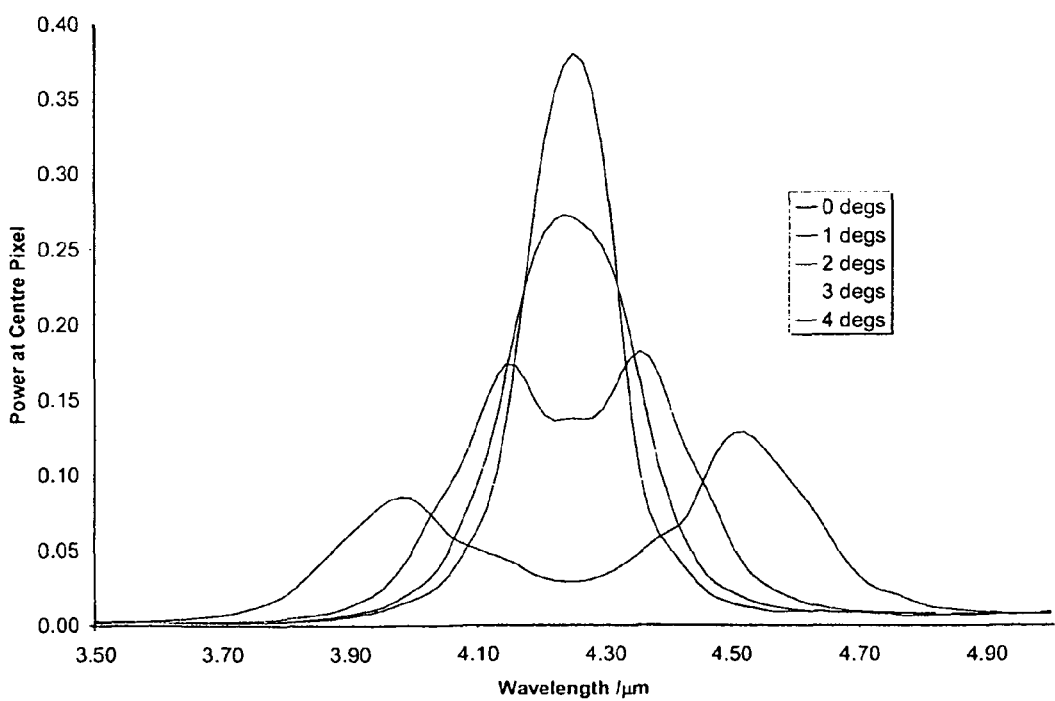
FIG. 12 shows a $CO_2$ lens filter response based on diffraction theory using a 60 $\mu m^2$ pixel area.

The frequency response has also been calculated using diffraction theory. The results are shown in FIG. 12 for a (60 µm)$^2$ pixel and are comparable with those from ray tracing. Since diffraction effects are not accounted for by the ray tracing that method gives a slightly narrower bandwidth despite the use of a larger pixel. Diffraction theory gives a FWHM bandwidth of 160 nm. This, of course, relies on the input beam being a plane wave at normal incidence. If the input beam contains a finite bandwidth of incidence angles the response will be broadened in line with FIG. 12.

It will be appreciated that if a DOE is designed to bring the m$^{th}$ order (here m=1) diffracted light of wavelength $\lambda_d$ to a focal point, then, the other wavelengths, $\lambda_{fp}$, also brought to the same focal point will be given by, $$\lambda_{fp} = \frac{m}{\lambda_d}$$

For the example design wavelength of 4.26 µm and m=1, the 2$^{nd}$, 3$^{rd}$, n$^{th}$ order harmonics are 2.13, 1.42, 1.065, 0.85 µm . . . . The diffraction efficiency for the even harmonics is zero, for the third harmonic and fifth they are 4.5% and 1.6% respectively. The latter will be significantly damped by the Si absorption however, this is not true of $\lambda$=1.42 µm. It will be understood therefore that any gas with an absorption line in the vicinity (±70 nm) could lead to cross sensitivity. For example, water vapour has an absorption line centred on 1.38 µm. However, the absorption coefficient is ~100 times less than $CO_2$, added to a 10 fold decrease in the DOE diffraction efficiency at this wavelength, the sensitivity to water vapour will be three orders of magnitude down on that for $CO_2$.

Figure 13:
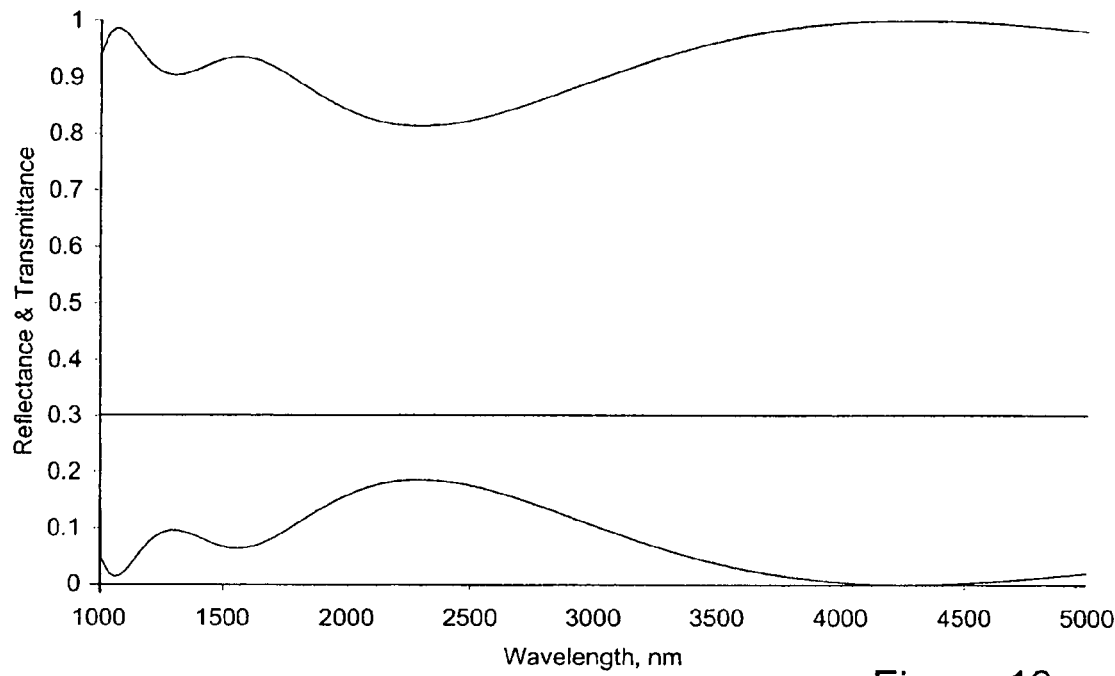
FIG. 13 shows reflectance and transmittance spectrum for an AR coated silicon substrate.
Figure 14:
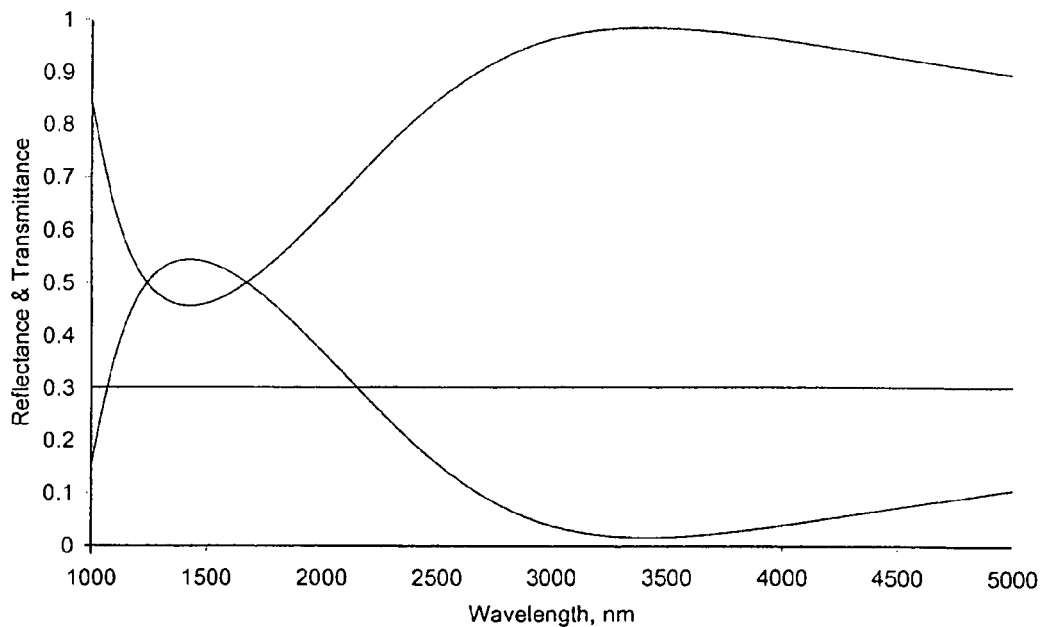
FIG. 14 shows reflectance and transmittance spectrum for an HR coated 1.42 µm silicon substrate.

To provide for improvements in response characteristics anti reflection (AR) or high reflection (HR) coatings can be applied to the top and/or bottom surfaces of the cap. For the wavelengths_in question for $CO_2$ this filter can use typical integrated circuits fabrication materials such as $Si_3N_4$ and $SiO_2$. For example, an AR coating of a 462 nm/258 nm oxide/nitride pair deposited on silicon will yield a zero reflectance (100% transmittance) at 4.26 µm. This can be compared to the 30% reflectance from a bare silicon interface at this wavelength. The reflectance and transmittance spectrum is shown in FIG. 13.

For a HR coating, consider we wish to suppress radiation at 1.42 µm. An HR pair of 185 nm/256 nm nitride/oxide films on silicon gives the response spectrum show in FIG. 14. The transmission at 1.42 mm is suppressed by a factor 2 (4 if the coating is applied on both silicon interfaces) with respect to the $CO_2$ wavelength.

The inclusion of such an additional set of thin layers necessitates modifying the actual DOE lens design but this will be well understood by those skilled in the art.

It will be understood that the sensors described herein have been illustrated with reference to exemplary embodiments. It will be understood that the features of any one embodiment may be used with those of another embodiment or indeed can be applied independently of the structural features of the other embodiment. Applications for such sensors can be in a plurality of environments such as IR to Digital converters, both single pixel and arrays.

Further applications include single point thermal measurement systems, e.g., digital thermometers, intruder alarms, people counting sensors, and into infra-red cameras to thermally image scenes. These and other applications will be readily apparent to the person skilled in the art on review of the teaching set forth here before. Therefore while the invention has been described with reference to preferred embodiments it will be understood that it is not intended that the invention be limited in any fashion except as may be deemed necessary in the light of the appended claims.

By providing an aperture stop it is possible to selectively obstruct the transmission of certain parts of the radiation onto the sensing portion of the sensor. In this way a narrowband response can be generated as required. It will be understood that provision of an on-axis stop can provide for a limiting of the effective receiving area of the sensing device. It will be understood that the "stop" that was described with reference to FIG. 9 was a circular stop provided in a lower surface of the cap and configured to prevent the transmission of directly transmitted light through the cap. It will be understood that such an arrangement provides a narrow band filter and the specifics of how such a narrow band filter are provided within the cap are not to be construed as being limited to that which was described herein for the purposes of explanation. Within the context of the present invention, any stop or narrow band filter which in combination with a diffractive optical element enables the selective transmission of incident radiation through the cap and onto the sensing element below could be usefully employed. It will be understood that it is not intended to limit the teaching of the invention to any one specific geometrical configuration. For example, the inverse of the circular obstruction of FIG. 9 will be a 'traditional' aperture stop, i.e., it defines the outer useful part of the DOE lens. Such an arrangement may be usefully employed where it is intended to stop rays originating from the extreme edges of the DOE for examples where the quality may be poorer with respect to the centre or, perhaps, you may wish to have a circular lens rather than the current rectangular lens. This will ensure the image is also circular. The additional circular obstruction then defines the inner useful part of the lens. A narrow, ring shaped, clear aperture might have beneficial filtering properties for other applications. Within this context it will be appreciated that it is not intended to limit the present invention to any one specific geometrical arrangement except as may be deemed necessary in the light of the appended claims.

The words upper, lower, inner and outer are used for ease of explanation so as to illustrate an exemplary illustrative embodiment and it in not intended to limit the invention to any one orientation. Similarly, the words comprises/comprising when used in this specification are to specify the presence of stated features, integers, steps or components but does not preclude the presence or addition of one or more other features, integers, steps, components or groups thereof. Furthermore although the invention has been described with reference to specific examples it is not intended to limit the invention in any way except as may be deemed necessary in the light of the appended claims, and many modifications and variations to that described may be made without departing from the spirit and scope of the invention. Indeed where integers or components are described with reference to any one specific figure it will be understood that such integers or components these could be interchanged or replaced with those from other figures or elsewhere without departing from the teaching of the invention.

The invention claimed is:

1. An electromagnetic radiation sensor comprising:
a first sensor element formed in a first substrate, and
a first cap formed in a second substrate, the first and second substrates being arranged relative to each other such that the first cap is provided over the first sensor element with a first cavity formed therebetween, thereby defining a first cell,
wherein the first cap includes a diffractive optical element and an aperture stop to operably allow a transmission of incident radiation of a predetermined wavelength through the first cap onto the sensor element,
wherein the aperture stop is positioned to overlie a central portion of the first sensor element so as to substantially block radiation that is incident on the aperture stop over the central portion while allowing radiation to reach the first sensor element only through a peripheral portion of the first cap.

2. The sensor of claim 1 wherein the first sensor element is formed from a multilayer structure having at least one absorber layer provided therein, characteristics of the absorber layer contributing to the wavelength response sensitivity of the first sensor element.

3. The sensor of claim 1 wherein an operating wavelength region of the sensor is at least partially determined by the dimensions of first sensor element, the characteristics of the diffractive optical element and nature of the aperture stop.

4. The sensor of claim 1, further comprising a second sensor element formed in the first substrate and a second cap formed in the second substrate, the first and second substrates being arranged relative to each other such that the second cap is provided over the second sensor element with a second cavity formed therebetween, thereby defining a second cell.

5. The sensor of claim 4, wherein the first cell provides an output based on a first response characteristic and the second cell provides an output based on a second response characteristic.

6. The sensor of claim 5 wherein the second cap includes a second diffractive optical element and an associated second aperture stop.

7. The sensor as claimed in claim 5 wherein the output of the second cell is lower than that of the first cell.

8. The sensor as claimed in claim 5 wherein the response characteristics of each of the first and second cells are a function of at least one of the following properties of each cell:
a) the optical response characteristic,
b) the electrical response characteristic,
c) the thermal response characteristic,
d) the nature of the radiation source used to illuminate each of the first and second cells.

9. The sensor as claimed in claim 5 wherein the second cap blocks a transmission of radiation through the second cap and onto the second sensor element, the aperture stop being provided as part of the first cap.

10. The sensor as claimed in claim 5 wherein the second cap filters at least a portion of radiation that is incident on the second cell, each of the first and second cells including a diffractive optical element and associated aperture stop configured to selectively allow different incident radiation of different wavelengths through to their respective sensor elements.

11. The sensor of claim 5 wherein the second cap includes an optically opaque coating so as to prevent transmission of radiation through the second cap and onto the second sensor element.

12. The sensor as claimed in claim 4 the first and second cavities are in fluid communication with each other.

13. The sensor as claimed in claim 4 wherein the first and second cavities are isolated from each other.

14. The sensor as claimed in claim 4 wherein the first and second sensor elements are infra-red sensor elements.

15. The sensor as claimed in claim 4 wherein the first and second caps are formed in the same second substrate, the sensor additionally comprising an outer cap, the outer cap being orientated over the second substrate, the outer cap including an optical element.

16. The sensor as claimed in claim 4 wherein each of the first and second sensor elements are adjacent to one another, each of the caps provided thereabove having side walls extending upwardly from the first substrate and supporting a roof therebetween, the roof being in a plane substantially parallel to the sensor element below and wherein each of the caps share a common central column, that extends downwardly from the roof, thereby defining chambers for each of the first and second sensor elements.

17. The sensor as claimed in claim 16 wherein the chamber for the second sensor element is treated to prevent a transmission of radiation through the second cap and onto the second sensor element.

18. The sensor as claimed in claim 17 wherein the treatment includes a doping of the side walls of the chamber.

19. The sensor as claimed in claim 17 wherein the treatment includes the application of a reflective coating on the roof of the second cap for the second sensor element.

20. The sensor as claimed in claim 16 wherein the central column does not extend fully from the roof to the first substrate, such that a gap is defined between a lower surface of the column and an upper surface of the first substrate.

21. The sensor as claimed in claim 20 wherein the width of the gap is comparable with the wavelength of the incident radiation being sensed.

22. The sensor as claimed in claim 20 wherein the provision of the gap allows for an equalisation of pressure between the chambers for the first and second sensor element.

23. The sensor as claimed in claim 4 wherein each of the first and second sensor elements is provided as a bolometer.

24. The sensor of claim 1 wherein the aperture stop is provided on a lower surface of the first cap.

25. The sensor of claim 1 wherein the aperture stop is provided on an upper surface of the first cap.

26. The sensor of claim 1 wherein the first cap includes an anti-reflective coating to improve the throughput of radiation incident on the peripheral portion of the first cap.

27. The sensor as claimed in claim 1 wherein the first and second substrates are provided in silicon.

28. The sensor as claimed in claim 1, wherein the ambient conditions and composition within the first cavity are specified.

29. The sensor as claimed in claim 1, wherein the first cavity is provided at a pressure lower than ambient pressure.

30. The sensor as claimed in claim 1, wherein the first cavity is populated with a gaseous composition selected for the application with which the first sensor is to be used.

31. The sensor as claimed in claim 30 wherein the gaseous composition comprises a gas having a thermal conduction less than the thermal conduction of nitrogen.

32. The sensor as claimed in claim 1 wherein the diffractive optical element is formed in an inner surface of the first cap.

33. The sensor as claimed in claim 1 wherein the diffractive optical element is formed in an outer surface of the first cap.

34. The sensor as claimed in claim 1 wherein diffractive optical elements are formed in both an outer surface and inner surface of the first cap, the combination of the optical elements adjacent to and remote from the first cavity forming a compound lens.

35. The sensor as claimed in claim 1 wherein a plurality of sensor elements are formed in the first substrate and the diffractive optical element is configured to selectively guide radiation of specific wavelengths to preselected ones of the plurality of sensor elements.

36. The sensor as claimed in claim 35 including a complex lens arrangement of two or more diffractive optical elements configured to selectively transmit incident radiation of predetermined wavelength onto the incident sensor elements.

37. The sensor as claimed in claim 1 wherein on arranging each of the first and second substrates relative to one another the first cap is formed by side walls extending upwardly from the first substrate and supporting a roof therebetween, the roof being in a plane substantially parallel to the first sensor element.

38. The sensor of claim 1, wherein the aperture stop is substantially opaque.

39. The sensor of claim 1, wherein the aperture stop and the diffractive optical element are positioned such that the radiation reaching the first sensor element through the peripheral portion of the first cap passes through the diffractive optical element.

40. The sensor of claim 1, wherein the diffractive optical element is formed across substantially the entire first cap, and the aperture stop is positioned at a central portion of the diffractive optical element when viewed from above the first cap.

41. A gas analyser comprising:
   a sensor element formed in a first substrate; and
   at least one diffractive optical element and an associated aperture stop formed in a second substrate, the first and second substrates being positioned relative to each other such that the second substrate forms a cap over the sensor element, the at least one diffractive optical element and associated aperture stop being configured to guide incident radiation on the cap through the cap and onto the sensor element, the distribution of incident radiation incident onto the sensor element being determined by a determined relationship between the aperture stop and diffractive optical element, the incident radiation guided having a wavelength indicative of the presence of a specific gas,
   wherein the associated aperture stop is positioned to overlie a central portion of the sensor element so as to substantially block a portion of the incident radiation that is incident on the aperture stop over the central portion while allowing another portion of the radiation to reach the sensor element only through a peripheral portion of the cap.

42. The analyser of claim 41 further including at least one reference sensor element formed in the first substrate and having a cap for the at least one reference sensor element formed in the second substrate, the reference sensor element providing an output that is useable with the output of the sensor element to provide an analysis of the gas.

43. The analyser of claim 42 wherein the output of the reference sensor element is independent of the output of the sensor element.

44. The analyser of claim 42 wherein the cap of the reference sensor element shields the reference sensor element from the incident radiation on the cap such that the reference sensor element provides an output independent of the intensity of the incident radiation.

45. The analyser of claim 42 wherein the cap of the reference sensor includes a diffractive optical element configured to allow selective transmission of incident radiation of a different wavelength onto the reference sensor element to that transmitted onto the sensor element.

46. The gas analyser of claim 41 including a plurality of sensor elements each having a specific wavelength response, the output of the plurality of sensor elements providing a gas wavelength signature spectrum.

47. A method of forming a sensor, the method comprising the steps of:
   forming a sensor element in a first substrate,
   forming a cap comprising a diffractive optical element and at least one aperture stop in a second substrate,
   bonding the first and second substrates together such that the second substrate is orientated relative to the first substrate so as to provide the cap over the sensor element, the diffractive optical element and aperture stop being configured to guide incident radiation onto the sensor element,
   wherein bonding the first and second substrates comprises positioning the at least one aperture stop to overlie a central portion of the sensor element so as to substantially block radiation incident on the at least one aperture stop over the central portion while allowing radiation to reach the sensor element only through a peripheral portion of the cap.

48. The method of claim 47, further comprising:
   forming a reference sensor element in the first substrate; and
   forming a shielding cap in the second substrate such that the shielding cap is provided over the reference sensor, the shielding cap serving to modify a transmission of radiation incident on the cap through and onto the reference sensor element.

* * * * *